United States Patent [19]

Martin

[11] Patent Number: 5,084,886
[45] Date of Patent: Jan. 28, 1992

[54] SIDE-PUMPED LASER SYSTEM WITH INDEPENDENT HEAT CONTROLS

[75] Inventor: Danny W. Martin, St. Charles, Mo.

[73] Assignee: Laser Diode, Inc., New Brunswick, N.J.

[21] Appl. No.: 591,290

[22] Filed: Oct. 1, 1990

[51] Int. Cl.⁵ .............................................. H01S 3/043
[52] U.S. Cl. ........................................ 372/36; 372/75
[58] Field of Search ................... 372/34, 36, 70, 75, 372/68

[56] References Cited

U.S. PATENT DOCUMENTS

| | | | |
|---|---|---|---|
| 4,173,738 | 11/1979 | Boling et al. | 372/68 X |
| 4,701,928 | 10/1987 | Fan et al. | 372/68 |
| 4,739,507 | 4/1988 | Byer et al. | 372/22 |
| 4,805,177 | 2/1989 | Martin et al. | 372/34 |
| 4,894,839 | 1/1990 | Baer | 372/93 |
| 4,901,324 | 2/1990 | Martin | 372/36 |
| 4,949,346 | 8/1990 | Kuper et al. | 372/36 |

*Primary Examiner*—William L. Sikes
*Assistant Examiner*—Galen J. Hansen
*Attorney, Agent, or Firm*—Haverstock, Garrett and Roberts

[57] ABSTRACT

A laser construction having a laser medium mounted on a mounting structure, and one or more diode laser pumped sources each formed by a plurality of laser diodes arranged in arrays and mounted on a mounting structure adjacent to the side of the laser medium in position such that when they are stimulated to lase their output radiation energy will be directed at the laser medium, insulation between the mounting structures for the laser medium and the laser diodes, and separate coolers for the mounting structures for the medium and for the pump sources including electrical connections thereto for controlling the temperature of the respective coolers. The invention also resides in such a structure wherein the medium is formed of separate medium portions, and the pump source on are mounted on separate mounting structures and are positioned separately excite the separate medium portions so as to produce separate laser output radiations therefrom.

15 Claims, 2 Drawing Sheets

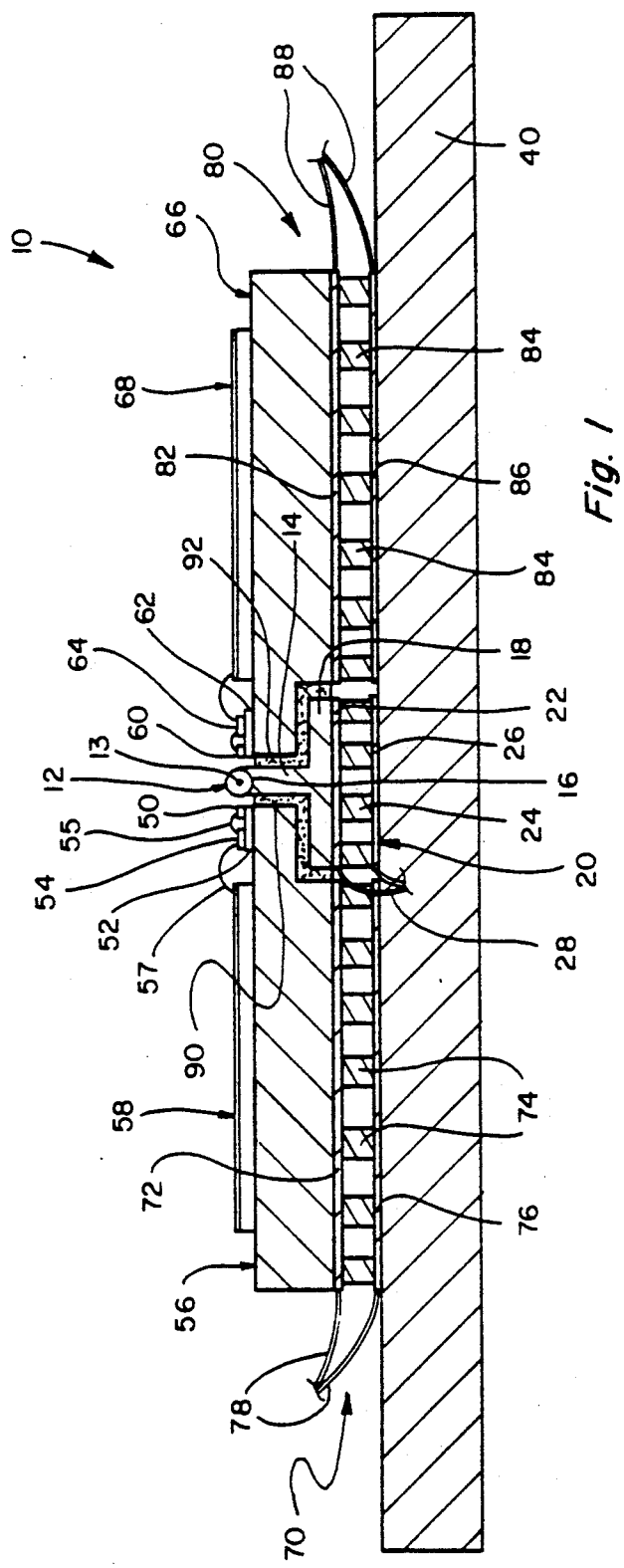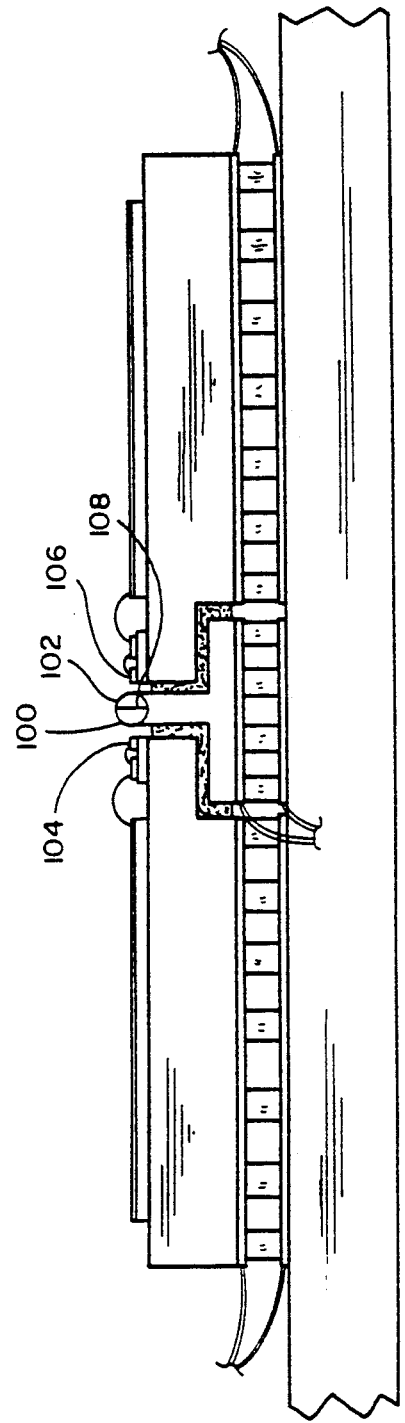
Fig. 1
Fig. 3

SIDE-PUMPED LASER SYSTEM WITH INDEPENDENT HEAT CONTROLS

FIELD OF THE INVENTION

This invention pertains to the field of diode-pumped lasers which use side-mounted laser diode pumps to excite a crystal or other laser gain medium including the possibility of producing two distinct outputs from a multipart medium.

BACKGROUND OF THE INVENTION

Diode-pumped lasers involve elongated semiconductor diodes which lase and producing unfocused radiation output when excited by an electrical field established thereacross. The lasing portions of the semiconductors are positioned near a laser gain medium such as a crystal (with a regular and repeated atomic lattice) or a glass (without a regular atomic lattice). Since most side-pumped diode lasers use crystals, the term "crystal" is occasionally used below for convenience, to refer to a preferred type of laser gain medium.

The unfocused laser energy from the semiconductors is directed into the crystal either directly or via one or more lenses. When "pumped" by the laser energy from the semiconductors, the energy excitation levels (sometimes referred to as population inversions) build up within the atomic structure of the crystal to an extent which causes the crystal to lase. The medium, which is usually elongated and provided with a mirror or other reflective coating at each end, focuses the laser energy along its main axis. The laser beam exits through one of the mirrors, which is made to be only partially reflective.

The term "laser head" is often used to refer to the assembly which comprises the gain medium, the lasing diode(s), the mirror(s), and any mounting devices which hold those components in their proper positions and alignment. A laser head can also include other components that are directly attached to the diode and crystal assembly, including possibly a housing and any necessary heat sinks. Typically, a laser head will include one or more electrical ports for the leads that supply the electrical energy from an external power source to the diodes.

The diode(s) used to excite or "pump" a laser crystal can be mounted at one end of an elongated crystal to create an end-pumped laser, or along one or more sides of the crystal to create a side-pumped laser. End-pumped lasers are limited in power, since only one diode or a small number of diodes can be mounted in close proximity to the end of the crystal. Side-pumped lasers can be more powerful, since a much larger number of diodes can be mounted along the length of the crystal to pump energy into it. Alternately, the radiant emission can be conveyed from the diodes to the crystal by means of one or more fiber-optic cables, but fiber-optic couplings suffer from reduced power, greater manufacturing expense, and other problems.

For more information on diode-pumped lasers see, e.g., W. Koechner, *Solid State Laser Engineering* (Springer-Verlag, New York, 1988), the article "Diode-Pumped Solid-State Lasers Have Become A Mainstream Technology" by G. T. Forrest in *Laser Focus-/Electro-Optics*. November 1987, pp. 62-74, the article "Advances in Diode Laser Pumps" by W. Streifer et al in *IEEE Journal of Quantum Electronics* 24 (6): 883-984 (June 1988), and various patents such as U.S. Pat. Nos. 4,864,584, 4,805,177 and 4,901,324 (Martin; assigned to Laser Diode Products, Inc., the predecessor company to the Applicant's assignee, Laser Diodes, Inc).

As is well known to those skilled in the art, one of the primary problems in operating any laser which utilizes a crystal lasing medium involves controlling and specifically limiting the temperature of the active elements including the laser diode pump sources on the gain medium or crystal. Two commonly used compositions for laser crystals are Nd:YAG (neodymium ions in a matrix of yttrium-aluminum-garnet) or Nd:YLF (neodymium ions in yttrium-lithium-fluoride). Such crystals are preferably operated at temperatures in the range of about 0° to about 30° C., from freezing to moderate temperatures. However, laser excitation can generate high temperatures, including localized "hot spots," which can interfere with the power and precision of the laser beam, and power and heat related problems reduce the strength and/or intensity of the beam. Precision-related problems also exist and are generally referred to as "noise" and can include variations in the wavelength or power, scattering and dispersion of the beam, and comparable problems.

In diode-pumped lasers, the diodes employed generate heat (including hot spots) and must be cooled. If not reduced, high temperatures (i.e., increased vibrations of the atomic lattices in the semiconductor material) can reduce operating efficiency, and can permanently damage or destroy the semiconductor materials of the diodes. High temperatures can also cause the diodes and crystal to become misaligned.

The magnitude and importance of the cooling problem can be seen in perspective by considering the efficiencies of diode-pumped lasers (usually measured in terms of the amount of power carried in the laser beam, divided by the total electrical power consumed by the laser equipment). Typically most diode-pumped lasers operate in the range of about 1% to 5% efficiency. Therefore to generate a laser beam carrying one watt of energy, a diode-pumped laser will have to dissipate as much as 100 watts or more of input energy and most of that energy must be dissipated as heat.

Furthermore, many lasers which cannot otherwise cope adequately with the problem of cooling must be operated only in a pulsed mode; i.e., their output is limited to short bursts of laser energy. Between pulses, such lasers must be deactivated so they can cool. However, it is often preferable and desirable in many applications to be able to operate lasers in the continuous wave (CW) mode.

Some types of lasers use a cooling fluid (such as water) which is pumped through one or more passages in the metallic structures used to mount the heat-generating components of the laser. However, such fluid-coolant systems require additional components, including a pumping system and a heat exchange system to cool the fluid. Those components add bulk, weight, and expense to the assembly, and can lead to various operating problems such as leakage of the coolant fluid. Water cooled lasers are also limited as to the environment in which they can be used.

Some diode-pumped lasers use devices called "thermoelectric coolers" (TEC's) to cool the crystals and the diodes to desired operating temperature ranges. In general, a TEC is a sandwich configuration, with two ceramic plates surrounding or on opposite sides of a plurality of "Peltier devices." The Peltier devices, which are usually int he shape of columns or cubes which separate the two plates, are made of a special alloy. When a suitable current is passed through a Peltier pellet, one end of the pellet becomes cold (the temperature can drop below 0° C.) and the other end becomes hot. The laser crystal and the diodes are mounted on or near the cold side, while the hot side of the TEC is attached to a heat sink which has means to dissipate the heat, often with the aid of a fan which flows air across fins on the heat sink.

Various types of heat sinks have been developed in the prior art for dissipating the heat generated by diode-pumped lasers. Conventional heat sinks are made of a heat-conductive material such as copper or aluminum, which usually contains fins to increase the exposed surface area. A cooling fan is often provided to blow air against the fins. Conventional heat-sinks of this nature are shown in, e.g., FIGS. 1 and 4 of U.S. Pat. No. 4,805,177 (Martin et al 1989; assigned to applicant's assignee).

A diode configuration which offers improved heat control is shown in U.S. Pat. No. 4,864,584, which is also assigned to Applicant's assignee. That patent discloses a structure with arrays of numerous very small elongated diodes which are closely packed together, see FIGS. 15 and 16 and Column 7 of this patent. In that arrangement, the heat generated by the numerous small diodes is distributed relatively evenly over the area on which they are mounted. Since the heat is distributed more evenly across the diode mount, hot spots, which can adversely effect operation, are minimized.

Despite those improvements, there remains a need to provide even more precise control over the temperatures of the diodes and crystals in side-pumped lasers. In particular, there is a need for a laser head assembly that provides independent temperature control over the diodes and the gain medium, since the optimal lasing temperature of a certain type of diode may be different than the optimal lasing temperature of a certain type of crystal. In some situations, it may be desirable to operate the diodes and the crystal at temperature differentials from each other, sometimes exceeding 20° C. In addition, since temperature can affect the wavelength and the frequency of the laser light, precise temperature control, if available, may be used to "tune" a laser diode or crystal to a preferred frequency.

OBJECTS OF THE PRESENT INVENTION

One object of the subject invention is to provide a side-pumped laser which allows for independent temperature control of the lasing diodes and the lasing gain medium.

Another object of the subject invention is to provide a side-pumped laser which can be operated for prolonged periods in the continuous wave mode, using diodes and crystals which have the same or different preferred operating temperatures including the possibility of substantially different operating temperatures.

Another object of the invention is to create diode-pumped lasers having improved efficiency, improved power output, increased precision, and reduced noise in the laser beam output.

Another object of this invention is to create side-pumped lasers having numerous diodes, all of which can be maintained at or near their optimum operating temperature independently of a gain medium which can also be maintained at or near its optimum operating temperature.

Another object of this invention is to provide a temperature control device which can support the operation of a laser gain medium device which contains two or more different types of gain medium, and which can emit laser radiation at two or more different wavelengths, in a single small laser cavity.

Another object is to insulate between the active elements and the supports therefore in a diode laser pumped laser device.

These and other objects and advantages of the present invention will become apparent after considering the following detailed specification which discloses preferred embodiments in conjunction with the accompanying drawings.

SUMMARY OF THE INVENTION

This invention resides in a diode-pumped laser device having lasing diodes mounted along one or more sides of a laser gain medium. The diodes are mounted on a first temperature control mounting system, and the gain medium is mounted on a second independent temperature control mounting system, allowing the diodes and gain medium to be operated at the same or at different temperatures.

In one embodiment, a first bank of miniaturized laser diode arrays is mounted alongside and in close proximity to a Nd:YAG or Nd:YLF crystal. The laser diodes are mounted on one or more diode bases, which are thermally conductive. The diode bases are mounted (via an alignment member, if desired) on the cold side of a first thermoelectric cooler (TEC). The laser crystal is mounted atop a crystal mounting base, which is also thermally conductive. The bottom of the crystal mounting base is mounted on the cold side of a second TEC, which is thermally and electrically independent of the first TEC, and which can have a different size, shape and operating temperatures, if desired. This allows the temperatures of the diode TEC and the crystal TEC to be maintained independently of each other, by controlling the amount of electrical current passing through each separate TEC. This in turn allows the crystal and the diodes to be maintained at different temperatures.

If desired, a second bank of diodes can be placed along another side of the crystal. That set of diodes can be thermally coupled to a third TEC which is independent of the other two TECs. This allows the second bank of diodes to be maintained at a temperature which is independent of the laser crystal and of the first bank of diodes, thereby enabling the use of a gain medium or laser crystal having distinct portions in a single envelope or cavity, and each crystal or crystal portion can generate a laser beam of a selected, independent wavelength. This type of "twin crystal" can emit parallel, closely spaced laser beams having different wavelengths. For example, a "twin crystal" can be formed having Nd:YAG on one side and Nd:YLF on the other side. By proper tuning and with the aid of frequency doublers, if desired, two closely spaced parallel laser beams having substantially different wavelengths (such as visible red and visible green) can be generated simultaneously using a single laser head. Also a reflective layer can be positioned between the crystal portion to increase their pumping efficiency.

BRIEF DESCRIPTION OF THE DRAWINGS

FIG. 1 is an enlarged cross-sectional elevational view of a side-pumped laser head constructed according to one embodiment of the subject invention, said view taken looking along the axis of the laser crystal, showing the diode pump sources mounted on mounting members that are in turn mounted on two independent thermoelectric coolers, and showing the crystal mounted on a separate mounting member which is mounted on a third independent thermoelectric cooler;

FIG. 3 is a cross-sectional end-view of a side-pumped laser head showing a crystal constructed of two different gain materials, mounted together in a single cavity to form a twin-crystal laser device capable of being stimulated to produce two parallel laser beams at distinct frequencies.

DETAILED DESCRIPTION OF THE PREFERRED EMBODIMENTS

Figure 2:
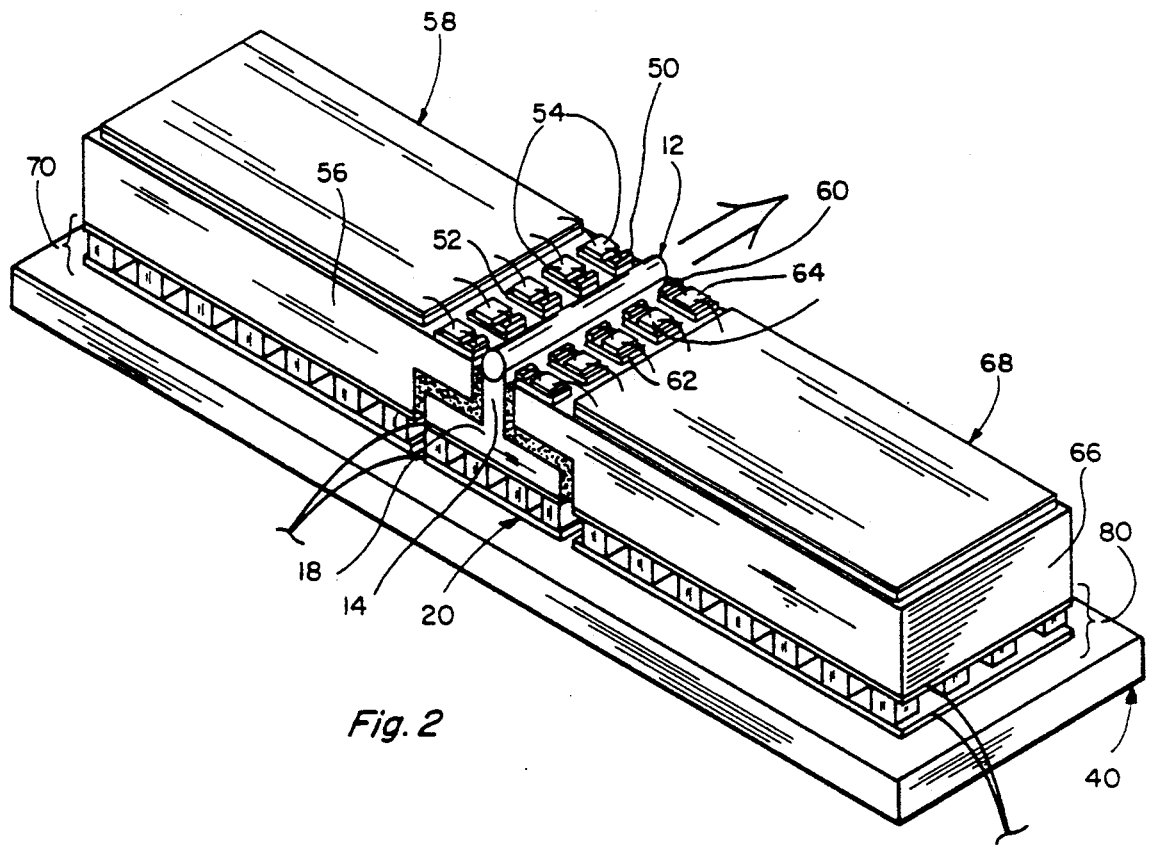
FIG. 2 is an enlarged perspective view of the subject laser device, showing two arrays of side-mounted diodes and a laser crystal, the arrays and crystal being mounted respectively on three independent thermoelectric coolers.

Referring to the drawings more Particularly by reference numbers, number 10 in FIG. 1 refers to a side-pumped laser head assembly constructed according to the present invention. The head 10 comprises a laser gain medium 12 which is an elongated single piece of crystalline or glass material such as a Nd:YAG or Nd:YLF crystal. The gain medium 12, which is also referred to as crystal 12 for convenience, is elongated as shown in FIG. 2 and has an optical axis 13. If desired, the crystal 12 can have a cylindrical shape with a circular cross-section. Alternately, it can have one or more flat surfaces, as does the gain medium shown in U.S. Pat. No. 4,805,177, or it can have a square, rectangular, or other cross-sectional shape.

The crystal 12 is shown mounted on an elongated flange 14 which contains a groove 16 that accommodatingly receives the crystal 12. The flange 14 is an extended portion of crystal mount 18. Both the mount 18 and the flange 14 are made of a heat-conductive material such as copper or aluminum, and can be formed of a single piece of machined metal or as an assembly formed from two components. The crystal 12 is securely affixed within the groove 16 by any desired means, such as heat-resistant cement.

The crystal mount 18 has its surface opposite from the flange 14 affixed to a thermoelectric cooler, referred to herein as crystal cooler 20. The cooler 20 has a cold side element 22, which typically is a layer of thermally-conductive ceramic; a plurality of Peltier devices 24, arranged in a plane; a hot side element 26, which is also a thermally conductive ceramic layer; and electrodes or leads 28, which electrically couple the layers 22 and 26 to a source of voltage. When an appropriate current passed through the Peltier devices 24 they generate cold regions adjacent to cold side element 22, thereby chilling the cold side element 22 and the crystal mount 18, which in turn chills or cools the crystal 12 to a temperature that can, if desired, be below 0° C. The opposing ends of Peltier devices 24 generate heat, which is transferred via hot side element 26 to a heat sink 40 which is attached thereto.

As shown in FIGS. 1 and 2, the crystal 12 is flanked along one side by a row of laser diode arrays 50. Each diode array 50 includes a small fragment from a semiconductor wafer which contains a plurality of laser stripes, as disclosed in U.S. Pat. No. 4,864,584 which is also assigned to the Applicant's assignee. The patent also discloses a structure with arrays of numerous very small diodes which are closely packed together, see FIGS. 15 and 16 and Column 7 of the patent. Briefly, a semiconductor wafer having a diameter of about 5 cm is generated with hundreds of parallel "laser stripes" each consisting of a small line where the doping of the semiconductor material is altered. The laser stripes are arranged in clusters, such as clusters of four or five stripes separated by small gaps having no stripes. The wafer is coated on one surface with a conductive layer of material such as gold, then it is cleaved by nicking the crystalline material in the gaps between each cluster of stripes and breaking the crystal along the cleave lines. This creates elongated pieces of material, each piece having four or five laser stripes running lengthwise thereacross. Each piece is then nicked a second time in a direction perpendicular to the laser stripes and is broken to form numerous small chips, each chip being roughly one millimeter wide and having four or five laser stripes that are electrically coupled to the layer of gold. Each chip is referred to as a "laser diode array." A single conductive lead is soldered to the layer of gold on each laser diode array. Thereafter when the laser diode array is excited by applying a voltage thereacross, each of the laser stripes functions as a laser diode pump source and emits laser radiation which is directed in a cone shape from the ends thereof and particularly from the ends adjacent to the gain medium 12.

Each of the diode arrays 50 is mounted (using a thermally and electrically conductive adhesive) on a diode base 52 made of heat-conducting metal such as copper. Also mounted on each diode base 52 is a wire bond pad 54, which comprises an electrically conductive layer (formed by electroplating or other suitable means) on top of a non-conductive, heat-resistant material such as ceramic. Each of the wire bond pads 54 is electrically connected by a wire 55 to a conductive layer on top of the adjacent diode array 50.

Numerous diode bases 52, each base containing one or more diode arrays 50 and an associated wire bond pad 54, are soldered onto a diode mount 56, as shown in FIGS. 1 and 2 which is constructed of a thermally conductive material. The diode mount 56 may be equipped with shim or threaded means (not shown) to adjust its positions in order to precisely align the diodes in the diode arrays 50 with the axis of the crystal 12. The adjustment means provide some ability to tilt the mount 56 and therefore to align the laser diodes with the crystal.

As shown in FIG. 1, other conductive leads 57 connect a printed circuit board (PCB) 58 located on the diode mount 56 to the wire band pads 54. One lead 57 is provided for connecting each pad 54 and the associated array to the PCB 58. If desired, each conductive lead 57 on PCB 58 can also be connected in parallel with a capacitor, not shown, to protect the diode arrays from current or voltage spikes.

The diode arrays 50 are positioned as close as possible to the side of the crystal 12, and are aligned in a manner so that virtually all of the radiation output from each diode pump source, which has a cone shape, directly enters the side of the crystal 12 and does not impinge on any other component. This is done to increase the operating efficiency.

In single-sided laser head configurations, only one row of diode lasers is provided as the pump source, such as the row of diode arrays 50. In double-sided configurations such as shown in FIGS. 1 and 2, a second row of diode arrays 60 mounted on second diode bases 62 is mounted on a second diode mount 66. The diodes are electrically coupled to wire bond pads 64 and to PCB 68 in the manner described above. The row of arrays 60 is shown located on the opposite side of the crystal 12 from the row of arrays 50 but the rows do not need to be diametrically opposite.

The diode mount 56 is attached by heat conductive means such as by a thermally conductive adhesive, to the cold side element 72 of another cooler 70. The cooler 70 also has a plurality of spaced Peltier devices 74, a hot side element 76, and suitable electric connections or leads 78. The cooler 70 is constructed and operated in the same manner as the crystal cooler 20 but is used to cool only the diode mount 56 and the associated elements including especially the diode arrays 50 mounted thereon.

Another similar cooler 80 has its cold side element 82 attached to the mount 66. The cooler 80 also has a plurality of Peltier devices 84, a hot side element 86, and electrical connectors 88. The cooler 80 is provided to cool the diode mount 66 and the associated row of diode arrays 60.

In a preferred embodiment, a layer 90 of thermal insulating material is positioned in the space between the diode mount 56 and the crystal mount 18 to reduce or minimize heat transfer between these components. Similarly, another layer 92 of thermal insulating material is placed in the space between the other side of the crystal mount 18 and the diode mount 66. The insulating material minimizes the effects of temperature differentials between the respective members and reduces warping or flexing between the components which otherwise might adversely affect such things as the alignment of the crystal, the orientation of the diodes, and the location of the reflecting mirrors relative to the crystal. The insulating material 90 and 92 can be injected while in liquid form during or after alignment of the diodes 50 and the crystal 12, so that it will harden while the elements are in the proper alignment. A matting of insulation can also be used, if desired and alternately, the crystal mount 18 can be separated from diode mounts 56 and 66 by air gaps or by gaps filled with some other suitable gas, or with a vacuum condition.

As shown in FIG. 1, the diode coolers 70 and 80 can be thermally attached on their hot sides 76 and 86 to the same heat sink 40 that is attached to crystal cooler 20 or separate heat sink can be provided for the different coolers. Since the thermal output (i.e., the temperature differential between the hot and cold sides) of each cooler can be adjusted and regulated independently by individually adjusting the amount of current which passes therethrough, the configuration with a single shared heat sink will still enable independent temperature control of the diodes and the crystal as desired. This configuration eliminates "direct" thermal coupling between the crystal mount 18 and either of the diode mounts 56 or 66. Although all of the mounts might be regarded as thermally coupled because of the common heat sink, the coupling is effectively overridden by the independent thermal control that can be exerted over the different coolers.

If each cooler is provided with its own separate heat sink which is possible, the dimensions of the heat sinks can be selected to have the desired heat dissipation characteristics. In some situations, this may actually reduce the total electrical energy that must be applied the thermoelectric coolers to produce the desired operating temperatures for the crystal and for the diodes. For example a laser installed in a satellite for transmitting therefrom may require little or no cooler energy because of the environment in which it is located and this can be highly advantageous or even essential. In such situations the size and complexity of the laser may also be substantially reduced.

In the embodiment of the invention shown in FIG. 3, the independent temperature control arrangement described above is used to cool both parts of a dual crystal member made up of portions 100 and 102. In this construction the crystal halves 100 and 102 are stimulated to lase by respective diode arrays 104 and 106. With this construction different gain materials to be used within a single gain medium. This "twin crystal" construction in a single laser head is capable of emitting parallel closely-spaced laser beams having the same or different wavelengths or other distinctive characteristics. For example one portion of the crystal in the construction of FIG. 3 can be operated in a continuous wave (CW) mode while the other portion is operated in a pulsed mode. Also, the diode arrays 104 can be tuned to generate unfocused laser radiation with one wavelength such as a wavelength of 806 nanometers (nm), the optimal absorption wavelength for crystal portion 100 which is made of Nd:YAG while the other diode arrays 106 can be independently tuned to emit at a frequency such as about 780 to 790 nm, the optimal absorption wavelength for crystal portion 102, which is made of Nd:YLF. The Nd:YAG crystal portion 100 can be tuned to cause it to emit a laser beam with a wavelength of 1320 nm, while the Nd:YLF crystal 102 can be tuned to emit a laser beam at 1064 nm. If desired, one or both of the laser beams can also be frequency-doubled which will convert the 1320 nm Nd:YAG beam output to a wavelength of 660 nm, a visible red wavelength, and it will convert the 1064 nm Nd:YLF beam to 532 nm, which is a visible green wavelength. By driving both arrays of diodes 104 and 106 and crystal portions simultaneously, red and green laser light can be emitted simultaneously by a single laser head. Operation at other frequencies is also possible. The beams that emerge from this type of twin crystal arrangement are parallel and spaced very close together and they can be operated simultaneously or independently. By using refractive or like devices, the separate beams can also be directed or redirected to different paths for different uses.

A reflective layer 108 can be placed between the crystal portions 100 or 102 as by electroplating a layer of gold, silver, or other reflective metal onto a flat surface on one or both of the crystal portions 100 and 102 or by adhesively attaching it including to hold the portions of the crystal together. The use of the reflective layer 108 will increase the absorption efficiency of the crystal portions while reducing any undesired cross-excitation that might otherwise occur between the crystal portions.

Figure 4:
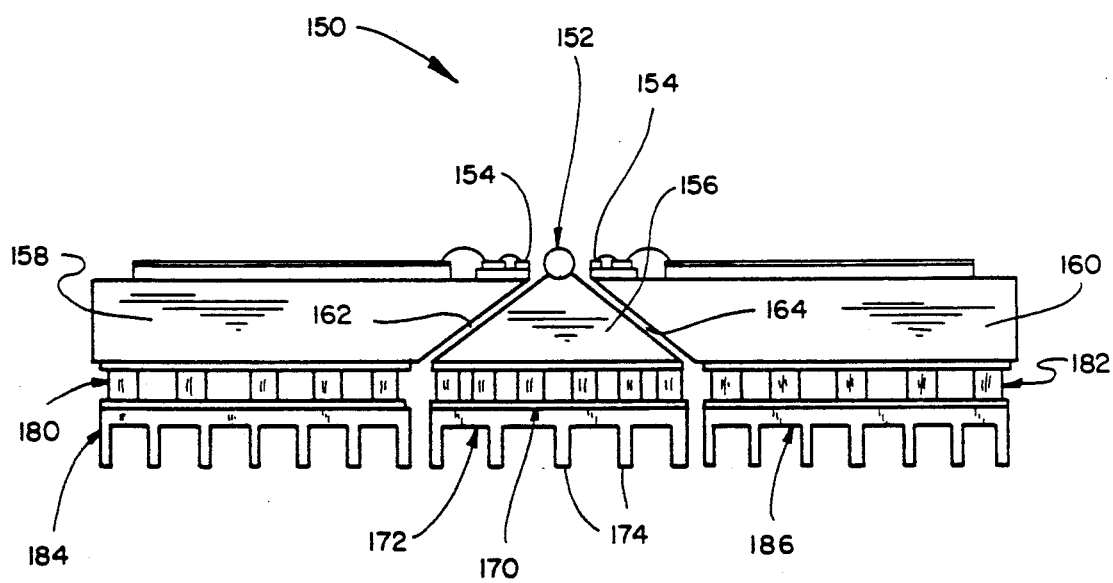
FIG. 4 is a cross-sectional end view showing another embodiment of a side-pumped laser with the crystal mounting means and the pump sources having separate heat sinks.

The laser assembly 150 shown in FIG. 4 includes several modifications to the embodiments described above. For example crystal 152, which is pumped by opposing diode arrays 154, is mounted in a groove on the narrow upper surface of a mounting structure 156 which is shown having sloping side walls and a relatively wide bottom surface. This construction will enable relatively high levels of heat to be withdrawn from the crystal as compared to other components of the construction 150. This is because of the greater size and the shape of the crystal support 156 which enables it to absorb and dissipate more heat as compared to member 18 for example. Diode mounts 158 and 160 have side edges that are shaped to be complementary to the respective side faces of the crystal mount 156 and are therefore somewhat smaller than the corresponding members 56 and 66 in FIGS. 1 and 2. FIG. 4 also has gaps 162 and 164 between the crystal mount 156 and the diode mounts 158 and 160 that can be filled or occupied by an insulation including air, gas, or a vacuum condition.

FIG. 4 also shows the use of a separate thermoelectric cooler (TEC) 170 for mounting the crystal mount 156, and the cooler is mounted on its own independent heat sink 172. The heat sink 172 is shown provided with cooling fins 174 against which air from a fan (not shown) can be blown for cooling purposes. The mounts 158 and 160 for the diode pump sources 154 are also mounted on separate TEC's 180 and 182 each of which is attached to its own heat sink 184 and 186. The construction shown in FIG. 4 is one of many possible variations that can be made in the size and shape of the mounting members used in the present construction.

Thus there has been shown and described novel means for operating side-pumped lasers having the pump source or sources and the crystal medium capable of being operated at the same or at different temperatures as desired. The present invention also discloses means for producing simultaneously or independently, two or more distinct laser outputs having different characteristics using a single laser head assembly. The present invention therefore fulfills all the objects and advantages set forth above. It will be apparent to those skilled in the art, however, that many changes, modifications, variations, and other uses and applications which do not depart from the spirit and scope of the invention are contemplated and will become apparent to those skilled in the art. All such variations and equivalents are deemed to be covered by the invention which is limited only by the claims which follow.

What is claimed is:

1. A laser head comprising:
   a a first mounting structure;
   b a plurality of diodes thermally coupled to the first mounting structure, said diodes being capable of emitting a radiation output when an electrical potential is applied thereacross;
   c a first thermoelectric cooler having a first side which thermally communicates with the first mounting structure, said first side capable of being cooled when an electrical potential is applied across the first thermoelectric cooler;
   d a second mounting structure positioned adjacent to the first mounting structure;
   e a laser gain medium mounted on the second mounting structure in position to be exposed to the radiation output emitted by the plurality of diodes;
   f a second thermoelectric cooler having a first side which thermally communicates with the second mounting structure, said first side of said second thermoelectric cooler capable of being cooled when an electrical potential is applied across the second thermoelectric cooler;
   g means thermally insulating the first mounting structure from the second mounting structure;
   h a third mounting structure positioned adjacent to the second mounting structure;
   i a second plurality of diodes thermally coupled to the third mounting structure, said second plurality of diodes being capable of emitting radiation output when an electrical potential is applied thereacross, said diodes being oriented so that the radiation output thereof is directed at the laser gain medium;
   j a third thermoelectric cooler having a first side which thermally communicates with the third mounting structure, said first side of said third thermoelectric cooler capable of being cooled when an electric potential is applied across the third thermoelectric cooler; and
   k means thermally insulating the third mounting structure from the second mounting structure.

2. The laser head of claim 1 wherein the laser medium includes a first gain medium portion positioned to be exposed to the radiation output of the diodes mounted on the first mounting structure, and a second gain medium portion positioned to be exposed to the radiation output of the diodes mounted on the third mounting structure.

3. The side-pumped laser head of claim 2 wherein the first and second gain medium portions have a layer of reflective material positioned therebetween.

4. A side-pumped laser head comprising:
   a a first mounting structure and a first set of laser diodes mounted thereon, said first set of laser diodes being capable of emitting lasing radiation in a first predetermined direction when an electrical potential is applied thereacross;
   b a second mounting structure and a second set of laser diodes mounted thereon, said second set of laser diodes being capable of emitting lasing radiation in a second predetermined direction when an electrical potential is applied thereacross;
   c a third mounting structure positioned between the first and second mounting structures;
   d a gain medium mounted on the third mounting structure in position to be directly exposed at spaced locations thereon to the radiation from the first and second sets of laser diodes, the gain medium having a first portion formed of a first substance positioned to be directly exposed to the radiation from the first set of laser diodes and a second portion formed of a second substance positioned to be directly exposed to the radiation from the second set of laser diodes, the first and second portions of the laser gain medium being capable when stimulated by the respective radiation from the first and second sets of diodes of producing distinctive beams of laser radiation;
   e a first thermoelectric cooler having a side which is cooled when electric energy is applied thereacross thermally communicating with the first mounting structure, a second thermoelectric cooler having a side which is cooled when electric energy is applied thereacross thermally communicating with the second mounting structure, and a third thermoelectric cooler having a side which is cooled when electric energy is applied thereacross thermally communicating with the third mounting structure; and
   f means thermally insulating the first, second, and third mounting structures from each other thereby enabling the temperature of each mounting structure to be independently controlled.

5. The side-pumped laser head of claim 4 wherein the first portion of the gain medium is formed of Nd:YAG and the second portion of the gain medium is formed of Nd:YLF.

6. The side-pumped laser head of claim 4 wherein the first and second sets of laser diodes each includes a plurality of laser diodes arranged in respective first and second sets of arrays.

7. The side-pumped laser head of claim 4 including means for respectively energizing the first and second sets of diodes independently of each other.

8. The side-pumped laser head of claim 4 wherein the first and second medium portions have a layer of reflective material positioned therebetween.

9. A laser device comprising an elongated laser medium having an optical axis, means for mounting the laser medium including a support structure formed of heat conductive material, a first plurality and a second plurality of aligned laser diodes arranged in first and second arrays, respectively, said arrays being positioned about the optical axis of the laser medium, each laser diode being capable of emitting laser energy when excited by a voltage applied thereacross, means for mounting the laser diodes extending along the medium such that the laser energy emitted by both of said arrays is projected into the medium producing a population inversion therein and an accompanying laser beam extending along the axis thereof, means including a second support structure for mounting the first array of laser diodes and a third support structure for mounting the second array of laser diodes, means insulating the support structure for the medium from the second and third support structures for the laser diodes, a first cooler assembly in heat conductive relation to the support structure for the medium, a second cooler assembly in heat conductive relation to the second support structure for the first array of laser diodes, and a third cooler assembly in heat conductive relation to the third support structure for the second array of laser diodes, each of said cooler assemblies having opposite side members one of which becomes cold and one of which becomes hot when a source of electric potential is applied thereacross.

10. The laser device of claim 9 wherein the laser medium has a first portion positioned to be exposed to the laser energy produced by the plurality of aligned laser diodes, and a second portion to be exposed to the laser diodes produced by the second plurality of laser diodes.

11. The laser device of claim 9 including means insulating between the support structure for the medium and the support structure for the second plurality of laser diodes.

12. A side-pumped laser head comprising:
a a first mounting structure having a surface with a side edge;
b at least one laser diode array mounted on the surface of the first mounting structure, said laser diode array including a plurality of semiconductor diodes mounted extending to adjacent to the side edge of said surface, each capable of producing lasing radiation output when an electrical potential is applied thereacross;
c a second mounting structure positioned adjacent to the first mounting structure;
d an elongated laser gain medium mounted on the second mounting structure in position to be exposed to the lasing radiation outputs of the semiconductor diodes in the array;
e a third mounting structure positioned adjacent the second mounting structure at an angle from the first mounting structure;
f a second array of laser diodes mounted on the third mounting structure including a plurality of semiconductor diodes each capable of producing lasing radiation output when an electrical potential is applied thereacross, said array being positioned on the third mounting structure and oriented thereon so that the radiation output of the laser diodes in the array is directed at and excites the gain medium,
g a first thermoelectric cooler having a side which becomes cold when an electric potential is applied thereacross, the side that becomes cold being thermally coupled to the first mounting structure;
h a second thermoelectric cooler having a side which becomes cold when electric potential is applied thereacross, the side that becomes cold being thermally coupled to the second mounting structure;
i a third thermoelectric cooler having a side which becomes cold when an electric potential is applied thereacross, the cold side being thermally coupled to the third mounting structure; and
j means for thermally insulating the first, second, and third mounting structures from each other.

13. The side-pumped laser head of claim 12 wherein the elongated laser gain medium comprises a first gain medium portion exposed to the radiation output of the laser diode array mounted on the first mounting structure, and a second gain medium portion exposed to the radiation output of the second laser diode array.

14. The side-pumped laser head of claim 13 wherein the first portion of said gain medium is formed of a Nd:YAG substance and the second portion of the gain medium is formed of a Nd:YLF substance.

15. The side-pumped laser head of claim 13 including a layer of reflective material positioned between the first and second gain medium portions.

* * * * *